United States Patent [19]

Guterman

[11] Patent Number: 4,599,706
[45] Date of Patent: Jul. 8, 1986

[54] NONVOLATILE ELECTRICALLY ALTERABLE MEMORY

[75] Inventor: Daniel C. Guterman, Fremont, Calif.

[73] Assignee: Xicor, Inc., Milpitas, Calif.

[21] Appl. No.: 734,478

[22] Filed: May 14, 1985

[51] Int. Cl.$^4$ ............................................. G11C 11/40
[52] U.S. Cl. .................................. 365/185; 365/149; 365/154; 365/182; 357/45
[58] Field of Search ............... 365/149, 189, 230, 154, 365/182, 183, 185; 357/45

[56] References Cited

U.S. PATENT DOCUMENTS 4,274,012 6/1981 Simko ................................. 365/189
4,300,212 11/1981 Simko ................................. 365/185
4,314,265 2/1982 Simko ................................. 357/23
4,486,769 12/1984 Simko ................................. 357/41

Primary Examiner—Terrell W. Fears
Attorney, Agent, or Firm—Fitch, Even, Tabin & Flannery

[57] ABSTRACT

A compact, floating gate, nonvolatile, electrically alterable memory device is fabricated with three layers of polysilicon. In a nonvolatile memory array, each cell is electrically isolated from other cells to eliminate data disturb conditions in nonaddressed cells of the memory array. The memory cell and array is described in a first embodiment as including four electrode layers, one of which being formed as a substrate coupling electrode. A second embodiment includes a three electrode layer device wherein the need for the substrate coupling electrode is eliminated.

29 Claims, 7 Drawing Figures

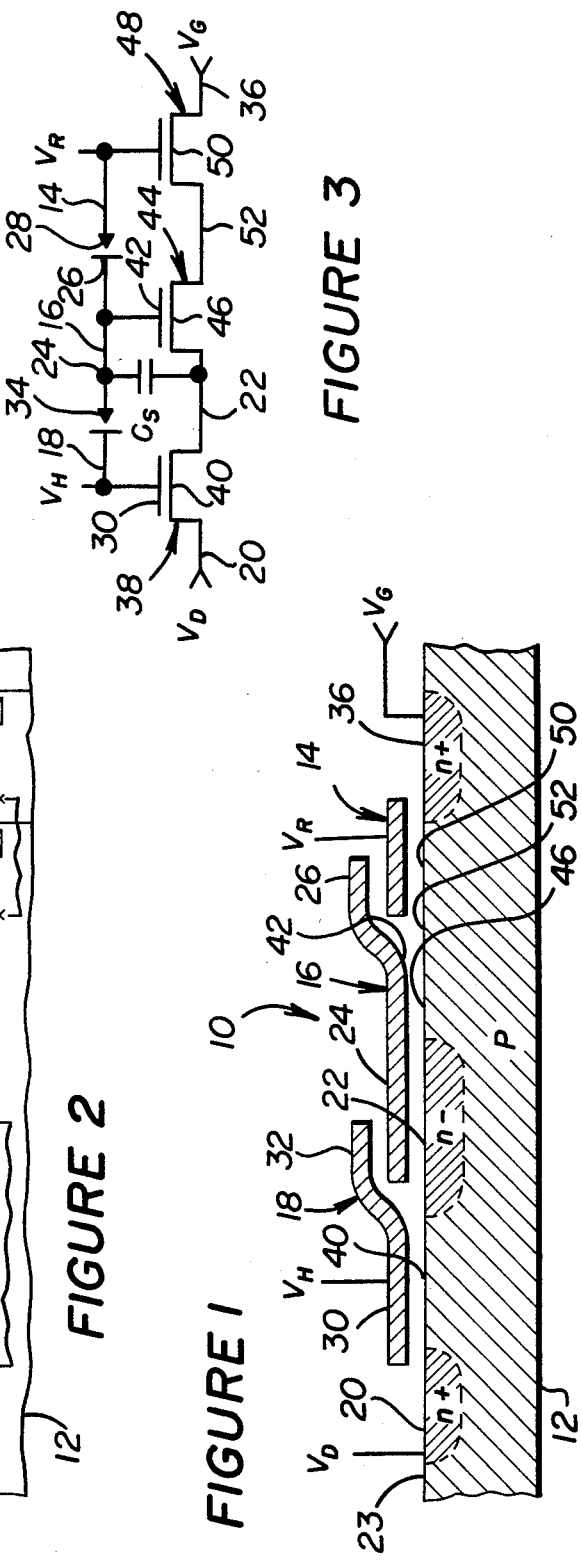
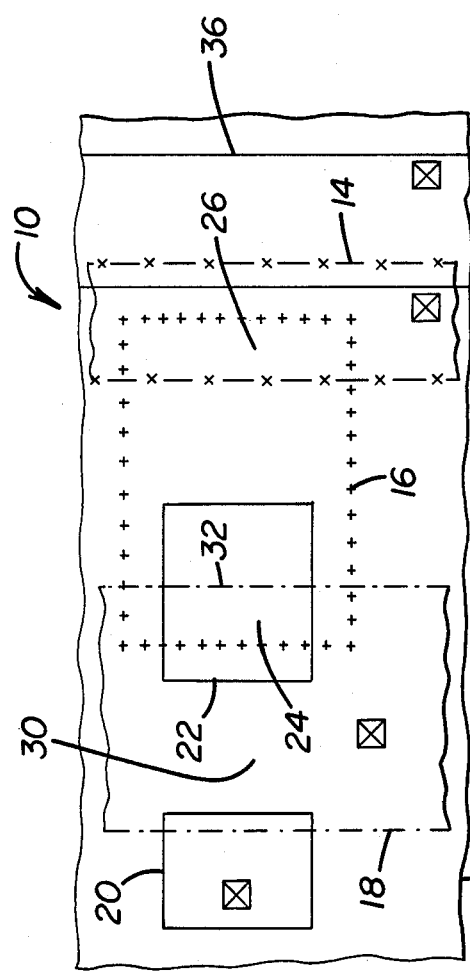
FIGURE 1
FIGURE 2
FIGURE 3

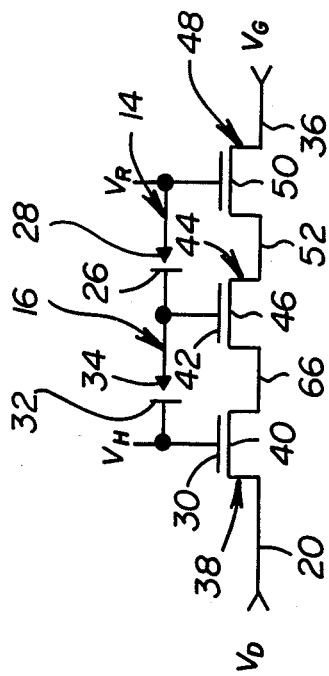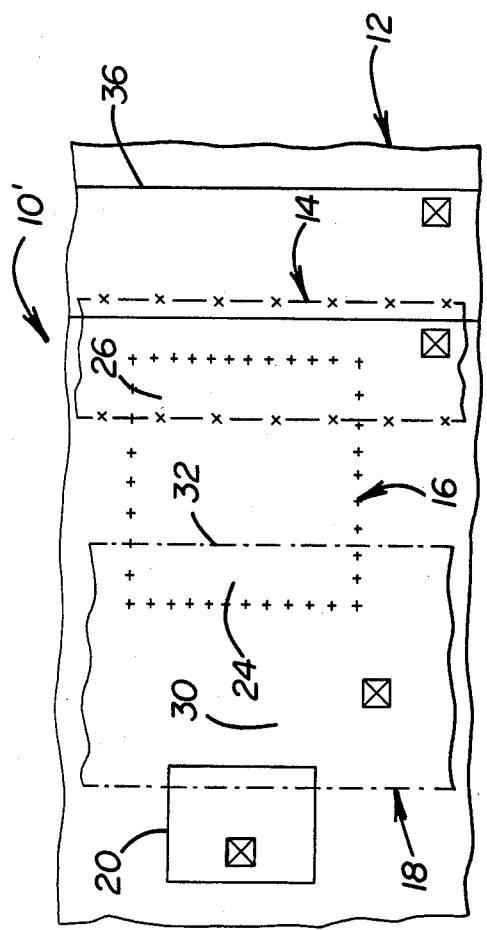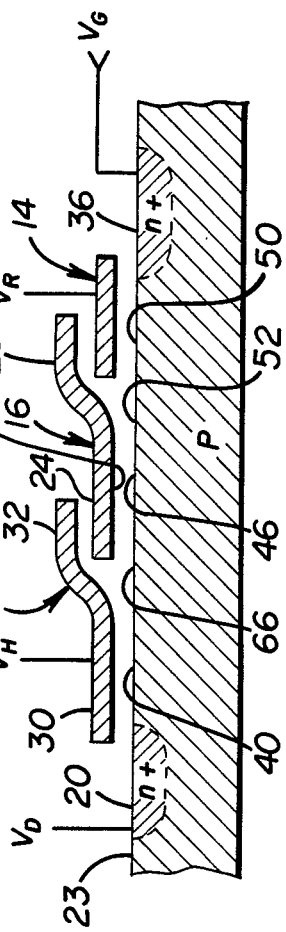
FIGURE 7
FIGURE 6
FIGURE 5

NONVOLATILE ELECTRICALLY ALTERABLE MEMORY

The present invention relates generally to integrated circuit programmable nonvolatile memory devices, and more particularly to an improved nonvolatile memory cell for increasing the density of the nonvolatile memory cells in such memory devices.

BACKGROUND OF THE INVENTION

In the prior art, integrated circuit memory devices have been developed which store data for indefinite periods of time in the absence of electrical power being applied thereto and which also have the capability of selectively changing or programming the data stored therein. Of particular interest herein is a nonvolatile memory cell which utilizes a floating gate as the nonvolatile element. See e.g., U.S. Pat. No. 4,314,265 which discloses a four polysilicon layer, floating gate nonvolatile memory cell, and U.S. Pat. No. 4,274,012 which discloses a three polysilicon layer, floating gate nonvolatile memory cell with substrate coupling. Either of these nonvolatile memory cells may be arranged, as is known in the art, to construct nonvolatile random access memories (NOVRAM's) and electrically erasable programmable read only memories (EEPROM's). See, e.g., U.S. Pat. No. 4,300,212, which discloses a NOVRAM device and U.S. Pat. No. 4,486,769, which discloses an EEPROM device. Of course, the principles of the present invention are applicable to other devices utilizing floating gate technology.

In U.S. Pat. No. 4,274,012 for example, the disclosed nonvolatile memory cell has three layers of polysilicon, each layer being generally electrically isolated from the substrate and each other. The first polysilicon layer is a programming electrode. The second polysilicon layer is the floating gate. The floating gate has a portion capacitively coupled to the programming electrode to form a programming tunneling region in which electrons tunnel from the programming electrode to the floating gate. Another portion of the floating gate is capacitively coupled to a n-implant region in the p-type substrate. The n-implant region is a bias electrode. The third polysilicon layer, which is an erase/store electrode, is capacitively coupled to a portion of the floating gate to form an erase tunneling region in which electrons tunnel from the floating gate to the erase/store electrode. Another portion of the erase/store electrode is capacitively coupled to the bias electrode in the substrate.

To initiate tunneling, a high potential, such as 25 v, is applied to the erase/store electrode while the programming electrode is held at a low potential, such as ground. The substrate bias electrode is caused to be held either at the low potential of the programming electrode or held at the high potential of the erase/store electrode, depending on whether electrons are to be tunneled from or to the floating gate, respectively. With the bias electrode held at the high potential, the floating gate being strongly capacitively coupled to the bias electrode is elevated to the high potential. Therefore, high potential exists across the programming tunneling region between the programming electrode and the floating gate so that electrons are tunneled onto the floating gate. Conversely, with the bias electrode held at the low potential, the floating gate will also be at the low potential because of the strong capacitive coupling to the bias electrode. Therefore, high potential exists across the erase tunneling region between the floating gate and the erase/store electrode. Electrons will then tunnel from the floating gate to the erase/store electrode.

The above-described nonvolatile memory cell, in one useful application, forms the nonvolatile portion of a NOVRAM memory cell disclosed in U.S. Pat. No. 4,300,212. The volatile portion of the NOVRAM memory cell is addressed, read from and written to in a manner known for MOS flip-flop type memory cells. The nonvolatile portion of the NOVRAM memory cell is coupled to the data and inverse data nodes of the volatile portion of the NOVRAM memory cell. The bias electrode is connected to the drain of an enhancement mode transistor with a grounded source. The data node of the volatile portion of the NOVRAM memory cell is coupled to the gate of this transistor. When the data node is at zero volts, representing one binary state, the transistor is turned off allowing the bias electrode to be at a floating potential. The bias electrode is further capacitively coupled to the erase/store electrode. Application of the high voltage store pulse to the erase/store electrode will cause the potential of the bias electrode to be elevated to the high potential. Electrons will then tunnel from the programming electrode to the floating gate, as described hereinabove, giving it a net negative charge. Conversely, when the data node is at 5 volts, representing the other binary state, the transistor is turned on thereby coupling the bias electrode to zero volts. Application of the high voltage pulse to the erase/store electrode will cause electrons to be removed from the floating gate by tunneling to the erase/store electrode, as described hereinabove, leaving a net positive charge thereon. Therefore, the charge of the floating gate stores the state of the data node of the volatile portion of the NOVRAM cell when the high voltage pulse is applied to the erase/store electrode.

To sense the charge on the floating gate, the floating gate forms the gate of an enhancement mode sense transistor. The drain of the sense transistor is coupled to the inverse data node of the volatile portion of the NOVRAM memory cell. The sense transistor is turned on when the floating gate has a net positive charge and is turned off when the floating gate has a net negative charge. Thus, the charge stored on the floating gate may be determined from the on or off state of the sense transistor and the potential of the inverse data node set therefrom upon power up of the NOVRAM device.

The nonvolatile memory cell described in U.S. Pat. No. 4,274,012, in another useful application, is used in the construction of each memory cell in an array of cells of an EEPROM device as disclosed in U.S. Pat. No. 4,486,769. In the array disclosed in this patent, the erase/store electrode is common to each cell in a column, and the programming electrode is common to each cell in a row. Furthermore, the bias electrode in each cell along a row are electrically connected to each other. To select one cell in the array, the programming electrode across the row in which the selected cell is located is held to a low potential, such as 0 volts and the erase/store electrode of the column in which the selected cell is located is raised to a high potential, such as 36 volts. The programming electrode in all other rows is raised to an intermediate potential, such as 26 volts and the erase/store electrode in all other columns is held to a low potential, such as 0 volts. The bias electrode for each cell in the row of the selected cell is driven to either the intermediate potential or the low potential, depending on whether the floating gate of the selected cell is to be programmed or erased, respectively. The bias electrode for cells in all other rows is driven to the intermediate potential. As described in the '769 patent, the full potential difference between the low and high potentials will exist across either the programming tunneling element or the erase tunneling element in the selected cell as a function of the bias electrode potential. Electrons will then tunnel across the selected tunneling element.

In all other cells along the row of the selected cell in this prior art EEPROM device, a potential difference exists across the tunneling element between its programming electrode and floating gate. The intermediate voltage applied to the bias electrode of the unselected cell is partially coupled to the floating gate while the programming electrode is held at the low potential. Since the unselected cell's erase/store electrode is also held to zero volts, the capacitive coupling between the erase/store electrode and the floating gate prevents the floating gate from having the same voltage as the bias electrode. Thus, when the capacitive relationships are selected as describe in the '769 patent, the floating gate in each of the cells in the row of the selected cell will not have a potential sufficient to initiate tunneling of electrons to the floating gate.

Similarly, a potential difference will exist across the tunneling region between the erase/store electrode and floating gate of all other cells in the column of the selected cell. Since the bias electrode and programming electrode of all nonselected cells in this column are at the intermediate potential, their floating gates will also have a potential near the intermediate potential. The erase/store electrode of these selected cells in the column will be at the high potential. The resultant potential difference across the erase tunneling region is therefore insufficient to cause elections to tunnel from the floating gate.

In each cell of this EEPROM device, a pair of transistors are coupled to the channel region of the substrate adjacent the floating gate. The gate of each of these transistors is formed from the erase/store electrode. Data potential is coupled to the channel region through one transistor and bias electrode potential is coupled to the channel region through the other transistor. To erase the floating gate, both the data potential and the bias electrode potential are at the low potential. To program the floating gate, both the data potential and the bias electrode potential are at the intermediate potential.

The above approach has several limitations. First, a number of capacitance interrelationships and tunnel voltage requirements must be maintained in order to avoid data disturbs of unselected cells during a write operation. In addition, logistical requirements of arrayed cells can make a single cycle write operation difficult to implement in practice. Consequently, in practical operation, before the floating gate is programmed, each EEPROM cell is first erased. Thus, each write cycle to a memory cell is preceded by an unconditional erase cycle, incurring unnecessary write time and cell wear out.

It is desirable to increase the number of memory devices which are fabricated from a single wafer to increase the chip yield per wafer and thereby to reduce the cost of each chip. In this regard, the size of each memory cell within the memory device must be reduced. However, such reductions in size do not allow a simple miniaturization of existing memory cells. For example, tolerances between mask levels may be difficult to maintain or the miniaturized design may require minimum channel widths not compatible with existing technology. Miniaturization of the above-described nonvolatile memory cell does not allow the necessary capacitive values and relationships to be maintained for an operational memory device. For example, should the required capacitive relationships in the EEPROM device described in the '769 patent not be maintained, the voltages described as occurring across the tunneling regions of unselected cells in the row and columns of the selected cell may be sufficient to cause inadvertent tunneling or a data disturb of the unselected cell. Furthermore, the overhead requirements of a separate and distinct bias electrode region for a write operation, and floating gate channel region for a read operation, combined with the aforementioned inherent tolerance requirements needed to prevent disturb conditions, makes shrinking of present memory cells for very high density applications impractical.

It is also desirable to eliminate one or more of the above-described capacitive couplings in the NOVRAM device. Such capacitive couplings introduce losses in obtaining the voltage relationships necessary to induce tunneling of electrons between the polysilicon layers. Eliminating such capacitors, therefore, would improve device operation. Furthermore, the elimination of these capacitances enables a greater degree of miniaturization, since the need for the large amount of chip real estate required to form such capacitors would be eliminated.

Furthermore, device operation and cell dimensions could be optimized by reducing component count in each memory cell and reducing the number of cycles required for a write operation. For example, in the EEPROM device, it is desirable that a write cycle (programming the floating gate) be accomplished in a single cycle obviating the need for an unconditional erase prior to each write cycle.

SUMMARY OF THE INVENTION

It is therefore an object of the present invention to provide a nonvolatile memory cell which is smaller than known nonvolatile memory cells.

It is an important object of the present invention to provide a nonvolatile memory cell which utilizes fewer components than known memory cells.

It is a further object of the present invention to provide a nonvolatile memory cell which eliminates some capacitive relationships, thereby minimizing the chip real estate required for forming such cells, since less overlap between layers of the memory cell is required.

It is another object of the present invention to provide a nonvolatile memory cell which obviates the requirement of an unconditional erase cycle prior to programming the floating gate.

It is yet a further object of the present invention to provide a dense nonvolatile integrated circuit memory device which substantially eliminates data disturb conditions in unselected cells of the memory device when writing into one or more selected cells.

The nonvolatile memory cell of the present invention includes three electrically isolated semiconductor layers, generally as described hereinabove. That is, the first layer forms the programming electrode, the second layer forms the floating gate, and the third layer forms the erase/store electrode.

According to the present invention, a first portion of the second layer is capacitively coupled to the first layer to form a first tunneling region therebetween, and a second portion of the second layer is capacitively coupled to a substrate region of opposite conductivity to the substrate. A third semiconductor layer is capacitively coupled to the second layer to form a second tunneling region. In operation, a reference potential is applied to the first layer. A voltage representative of the data state to be stored by the charge on the second layer is applied to another substrate region of opposite conductivity to the substrate type. The third layer forms the gate of an enhancement mode transistor between each substrate region. Upon application of a selected potential to the third layer, the transistor is turned on to create a conductive path between each substrate region. If the data state voltage is similar to the potential applied to the third layer, electrons will tunnel from the first layer to the second layer leaving the second layer with a net negative charge. Conversely, if the data state voltage is significantly less than the voltage of the potential applied to the third layer, electrons will tunnel from the second layer to the third layer leaving the second layer with a net positive charge.

Thus, an advantage of the present invention over the above-described prior art devices is seen. The present invention eliminates the need for capacitive coupling between the third semiconductor layer, the erase/store electrode, and the bias electrode as described above with reference to the NOVRAM device. As previously described, the capacitive coupling allowed the bias electrode to float to the potential of the erase/store electrode. The transistor switch needed to control the potential of the bias electrode in the nonvolatile cell of the NOVRAM device is also eliminated.

. In the present invention, the potential of the substrate region capacitively coupled to the second layer, the region that is analogous to the bias electrode described in the prior art, is determined by the data state potential. The third layer forms the transistor gate which controls conductivity between the first and second substrate regions, thereby eliminating the need for a separate transistor switch for controlling the bias electrode potential.

Furthermore, the substrate region of opposite conductivity to the substrate and capacitively coupled to the second layer may be eliminated altogether. In a second embodiment of the present invention, the capacitive relationships required to induce tunneling between the first and second layer or second and third layer are controlled by the capacitance inherent between the second layer and the substrate itself. By eliminating the first substrate region altogether, the nonvolatile cell may have overall dimensions considerably less than the prior art nonvolatile cells described hereinabove, since the overlap dimensions of the layers which form such capacitances are eliminated. A further advantage of the second embodiment of the present invention is that it requires one less semiconductor layer as compared with the memory cell disclosed in U.S. Pat. No. 4,314,265, a prior art cell also having no substrate electrode.

These and other objects and advantages of the present invention will become more apparent from the following specification when read in conjunction with the accompanying drawings and appended claims.

BRIEF DESCRIPTION OF THE DRAWINGS

FIG. 1 is a schematic cross sectional view of a nonvolatile memory cell constructed according to the present invention;

FIG. 2 is a plan view of the memory cell of FIG. 1;

FIG. 3 is an equivalent electrical circuit of the nonvolatile memory cell illustrated in FIG. 1;

FIG. 5 is a schematic cross sectional view of another embodiment of a nonvolatile memory cell according to the present invention;

FIG. 6 is a plan view of the memory cell of FIG. 5; and

FIG. 7 is an equivalent electrical circuit of the memory cell of FIG. 5.

DESCRIPTION OF THE PREFERRED EMBODIMENTS

Figure 4:
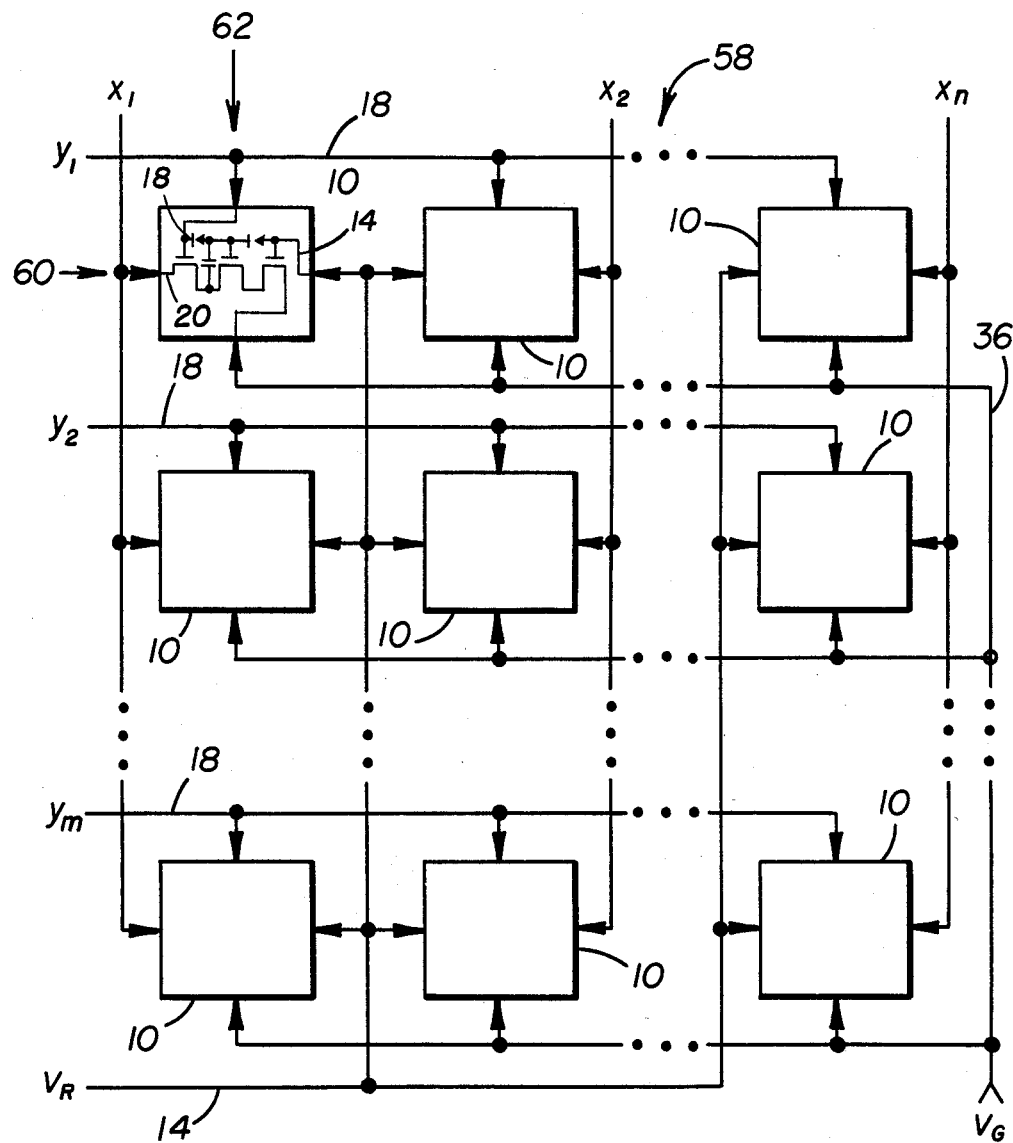
FIG. 4 is an equivalent electrical schematic block diagram of an array of memory cells, constructed according to the principles of the present invention useful for illustrating formation of an integrated circuit nonvolatile memory device according to the present invention.

Referring now to FIGS. 1-3, there is shown a nonvolatile memory cell 10 constructed according to the present invention. Memory cell 10 includes a substrate 12 of a first conductivity type, a first electrically isolated semiconductor layer 14, a second electrically isolated semiconductor layer 16 and a third electrically isolated semiconductor layer 18.

Substrate 12 includes a first substrate region 20, a second substrate region 22, and a surface 23. Each substrate region 20 and 22 is disposed in surface 23 and is of a second conductivity type opposite the first conductivity type of substrate 12.

Second semiconductor layer 16 has a first portion 24 capacitively coupled to second substrate region 22 and a second portion 26 capacitively coupled to first semiconductor layer 14. The capacitive coupling between first portion 24 of second layer 16 and second substrate region 22 is best seen in FIG. 3 as capacitance $C_S$. The capacitive coupling between second portion 26 of second layer 16 and first layer 14 is best seen in FIG. 3 as a tunneling region 28.

Third semiconductor layer 18 has a first portion 30 extending between first substrate region 20 and second substrate region 22 and spaced from surface 23, and a second portion 32 capacitively coupled to second layer 16. The capacitive coupling of second portion 32 to second layer 16 is best seen in FIG. 3 as a tunneling region 34.

Substrate 12 further includes a third substrate region 36 of the second conductivity type. First semiconductor layer 14 and third substrate region 36 extend generally parallel with each other. First semiconductor layer 14 and third substrate region 36 are common to each cell 10 of the memory array described hereinbelow. The parallel relationship between these elements simplifies the fabrication process and operation of the array as well as satisfying the electrical relationships between first semiconductor layer 14 and third substrate region 36, as described herein.

As best seen in FIG. 3, first portion 30 of third semiconductor layer 18 forms the gate of an enhancement mode transistor 38, having a channel 40 disposed between first substrate region 20 and second substrate region 22. These latter substrate regions 20, 22 form the drain and source of transistor 38, respectively. A third portion 42 of second semiconductor layer 16 forms the gate of an insulated gate transistor 44, also referred to herein as the floating gate transistor. Transistor 44 is an enhancement mode transistor in the present embodiment but could also be a depletion mode as well if performance adjustments are needed. Second substrate region 22 forms the drain of transistor 44. Third portion 42 of second semiconductor layer 16 overlays a channel 46 of transistor 44. First semiconductor layer 14 forms the gate of a enhancement mode transistor 48. Transistor 48 could also be a depletion mode transistor as well if performance adjustments are needed. Third substrate region 36 forms the source of transistor 48. First semiconductor layer 14 overlies a channel 50 of transistor 48. Transistors 44 and 48 are connected to each other by a region 52 between channel 46 and channel 50 of transistor 44 and transistor 48, respectively. Region 52 can be best described as a virtual junction. Transistor 44 and transistor 48 are equivalent to a single enhancement (or depletion, if so used) mode transistor having two adjacent gates, wherein third portion 42 of second semiconductor layer 16 forms one gate and first semiconductor layer 14 forms a second gate adjacent the first gate thereof.

Having described above the construction of nonvolatile memory cell 10, described below the operation of this nonvolatile memory cell 10. The mechanism for tunneling of electrons across tunneling regions 28 and 34 is well known in the art. For example, U.S. Pat. No. 4,274,012 (the '012 patent) describes such tunneling through the oxide layers which separate the polysilicon layers. It is of course understood that FIG. 1 in the present case is diagrammatic in illustrating the nonvolatile cell. Not shown are oxide or other dielectric layers which are grown or deposited on the substrate and on each semiconductor layer during the fabrication of cell 10 to electrically isolate it from the next level of semiconductor material deposited on the device. The requirements for the thickness of the oxide layers between the semiconductor layers 14, 16 and 18 are described in the '012 patent. Therefore, the portions of the '012 patent which describe the tunneling of electrons through the oxide layer, as well as the requirements for the thickness of the oxide separating the semiconductor layers and the capacitive relationships necessary to enable tunneling and which are not inconsistent with the disclosure of the present invention, are incorporated herein by reference.

A bias potential $V_R$ is applied to first semiconductor layer 14 and a reference potential $V_G$ is applied to third substrate region 36. For high voltage power considerations during tunneling of electrons across either tunneling region 28 or tunneling region 34, the bias potential of first semiconductor layer 14 forming the gate of transistor 48 and the reference potential of third substrate region 36 forming the source of transistor 48 are selected so that no current is developed in channel 50 from virtual junction 52 (equivalent to the electrical connection between the drain of transistor 48 and source of transistor 44) to third substrate region 36 in either direction. Accordingly, the gate-source voltage, given by $V_R - V_G$, of transistor 48 is normally biased negatively in a preferred embodiment of the present invention during tunneling so that transistor 48 remains in a "cutoff" condition irrespective of the drain voltage at virtual junction 52.

A data potential $V_D$ is applied to first substrate region 20 whose level represents the data state to be stored on second semiconductor layer 16. For example, the first binary state may be represented by a low potential and the other binary state may be represented by a high potential. Concurrently with applying the data potential $V_D$ to first substrate region 20, a control potential $V_H$ is applied to third semiconductor layer 18. The control potential $V_H$ is selected to invert the conductivity of channel 40 sufficiently to conduct the full data potential $V_D$ applied to first substrate region 20 to second substrate region 22 through turned on transistor 38. The control potential $V_H$ and the data potential $V_D$, when $V_D$ is in a high data potential state, are selected to ensure that sufficient potential difference exists across the tunneling region 28 so that electrons tunnel to second semiconductor layer 16. With control potential $V_H$ set at the level just described, the data potential $V_D$, when $V_D$ is in a low data potential state, is selected so that sufficient potential difference exists across tunneling region 34 so that electrons may tunnel from second semiconductor layer 16 to third semiconductor layer 18. Second semiconductor layer 16 forms the floating gate of nonvolatile memory cell 10 and is hereinafter also referred to as floating gate 16.

For example, when the data potential $V_D$ applied to first substrate region 20 is high and a sufficiently high control potential $V_H$ is applied to third semiconductor layer 18, the data potential $V_D$ is coupled to second substrate region 22, causing substrate 22 to also attain a high potential so that little potential difference exists between third semiconductor layer 18 and second substrate region 22. Floating gate 16 will also attempt to reach a high potential because of the capacitive coupling of capacitor $C_S$ and the capacitive effects of tunneling element 34 and channel 46. As the potential of floating gate 16 goes high, little potential difference will exist across tunneling region 34 and a large potential difference will then exist across tunneling region 28. Consequently, electrons will tunnel from first semiconductor layer 14 to floating gate 16.

Conversely, when the data voltage $V_D$ is low, the potential of second substrate region 22 is also low. The capacitance $C_S$ between first portion 24 of floating gate 16 and second substrate region 22 as well as the capacitive effects of tunneling element 28 and channel region 46 will attempt to capacitively hold the floating gate 16 low upon application of the control potential $V_H$ to third semiconductor layer 18. Therefore, the potential difference across tunneling region 28 is small and the potential difference across tunneling region 34 is large. As a result, electrons will tunnel from floating gate 16 to third semiconductor layer 18.

An advantage of the present invention over the memory cells disclosed in the above-identified patents is that the n-implant regions of the first substrate region 20 and second substrate region 22 may be considerably smaller than the bias electrode shown in these patents. In contrast to the NOVRAM device described in the '212 patent, no capacitive coupling is required between the third semiconductor layer 18 and a bias electrode in the substrate. In the NOVRAM device, it was this capacitive coupling which let the bias electrode float to the potential of the control voltage to bias the floating gate. Since such capacitive coupling is not required in the present invention, the third semiconductor layer may be made smaller since no dimensions necessary for the capacitive tolerances need be maintained. Described below is the advantage of the present invention over the prior art in terms of eliminating data disturb problems in EEPROM memory cells that are not being written to.

In digital systems, binary state voltage levels are usually 0 volts and +5 volts. It is desirable that the integrated circuit memory device utilizing nonvolatile memory cell 10 of the present invention is operable from these voltages. A charge pump may be included in the integrated circuit memory device to obtain a high potential in the range 25-35 volts from an externally applied 5 volt source. Such a charge pump is described in U.S. Pat. No. 4,326,134. The portions of this patent describing the control of the charge pump and switching of the high potential to the nonvolatile memory cell are incorporated herein by reference. Of course, it is within the ordinary skill of the art to provide a data voltage $V_D$ substantially equal to control voltage $V_H$ when the incoming binary data has one data state and to provide a $V_D$ of zero volts when the incoming binary data has the other binary state.

The nonvolatile memory cell 10 in accordance with the invention can be used to form a memory array such as an electrically alterable read only memory array with the addition of commonly known decoding and buffering systems in such memory devices.

Referring now to FIG. 4, there is shown a memory array 58 comprising a plurality of nonvolatile memory cells constructed as described hereinabove with reference to memory cell 10. Third substrate region 36 is a bulk implant region common to each cell 10 as best seen in FIG. 4. First semiconductor layer 14, to which the bias potential is applied, is also common to each cell 10 and may be a bulk semiconductor layer. Each third semiconductor layer 18, in the preferred embodiment of the present invention, forms a word line $Y_i$ common to a row of nonvolatile memory cells 10. For example, first word line $Y_1$ connects the top row 60 of nonvolatile memory cells 10 in memory array 50. Thus, word line $Y_1$ is a bulk semiconductor layer forming third layer 18 of each nonvolatile cell 10 in row 60. First substrate region 20 in each column of nonvolatile memory cell 10 is connected to a bit line $X_j$. For example, in the first column 62 of nonvolatile memory cells 10, the bit line $X_1$ is coupled to the first substrate region 20 of each cell. Each substrate region 20 in column 62 is connected to bit line $X_1$ by a metallization deposited over oxide. Of course, it is within the ordinary skill of the art to provide row and column decoders in a memory array.

The above described array 58, when configured as an EEPROM device, has several advantages compared to the EEPROM device disclosed in U.S. Pat. No. 4,486,769 in terms of eliminating data disturb problems in unselected memory cells. One such advantage is the elimination of partial tunneling voltages appearing across either of tunneling element 28 or tunneling element 34 in any unselected cell. Since transistor 38 is operated in a cutoff condition in all unselected cells, no partial voltage can be coupled to the floating gate 16 in such unselected cell by the application of a high data potential $V_D$ along any column data line $X_j$ to the first substrate region 20 of the unselected cell. Furthermore, in contrast to the selection of a single cell, as described in the '769 patent, the device of array 58 selects all cells along a row having a common word line $Y_i$ formed by third polysilicon layer 18. This word select capability of array 58 eliminates the application of a high voltage to one side of a tunneling element in an unselected cell.

Referring now to FIGS. 5-7, there is shown an alternate embodiment of a nonvolatile memory cell 10' which allows further miniaturization over the above-described nonvolatile memory cell 10. Identical reference numerals are used in FIGS. 5-7 to identify the identical components described above in conjunction with nonvolatile memory cell 10 with reference to FIGS. 1-3. The difference in fabrication in nonvolatile memory cell 10' is the elimination of second substrate region 22 underneath floating gate 16 and hence the elimination of capacitor $C_S$. The elimination of this capacitance allows the dimensions of floating gate 16 to be reduced since it does not need to function as one plate of capacitor $C_S$. Also, elimination of second substrate region 22 allows second semiconductor layer 16 and third semiconductor layer 18 to be made smaller so that the critical dimensions, especially overlap, are selected with regard only to the capacitive coupling therebetween to form tunneling region 34. The other remaining construct on the size of second semiconductor layer 16 is that its overlap to first semiconductor layer 14 must be sufficient to achieve the necessary capacitive coupling to form first tunneling region 28.

Further according to alternate embodiment 10', instead of having second substrate region 22 form a conduction path between transistors 38 and 44, a virtual junction 66 is formed therebetween, connecting the channel region 40 of transistor 38 and the channel region 46 of transistor 44. Thus, in the circuit of FIG. 7 transistor 44 and transistor 48 are equivalent to a triple gate enhancement mode transistor. Otherwise, the construction of nonvolatile memory cell 10' is identical to the above-described nonvolatile memory cell 10. Furthermore, nonvolatile memory cell 10' may be used in the memory array described with reference to FIG. 4.

A further advantage to removing second substrate region 22 is the reduction in the size of memory cell 10' by virtue of the removal of the substrate region separation requirements imposed by alignment tolerances, critical dimension control or electrical constraints. For example, the size of second substrate region 22 and first portion 24 of floating gate 16 are determined by alignment and electrical requirements required to ensure a properly sized channel 46 of floating gate transistor 44 and sufficiently sized plates for capacitor $C_s$, as well as ensuring channel 40 is of proper length for transistor 38. The overlap requirements of third polysilicon layer 18 to second substrate region 22 also must be considered in sizing region 22. Without any overlap, discontinuity may occur between channel 40 of transistor 38 and second substrate region 22. In nonvolatile memory cell 10', this overlap requirement is eliminated, thereby eliminating these tolerance constraints between mask layers.

Referring now in greater detail to the operational characteristics of nonvolatile memory cell 10 of FIGS. 1-3, the tunneling region can be thought of as a voltage actuated switch having zero conduction for a voltage less than $V_x$ and a very high conduction for a voltage greater than or equal to $V_x$. In the following example, the bias potential $V_R$ is set to zero volts. When the control potential $V_H$ is less then twice the potential $V_x$ and the data potential $V_D$ is equal to the control potential $V_H$, then during programming of floating gate 16 when $V_{fg}$ of floating gate 16 attempts to go beyond the potential $V_x$, the potential $V_{fg}$ of floating gate 16 becomes clamped to $V_x$ resulting in a floating gate potential after programming given approximately by the equation $$V_{fg} \approx V_x - V_H((C_s+C_e)/(C_s+C_e+C_p)) \quad (1)$$

where $C_p$ is the capacitance of tunneling element 28 and $C_e$ is the capacitance of tunneling element 34.

For example, if $V_x$ equals 12 volts and $V_H$ equals 20 volts and $C_e$ equals $C_p$ while $C_s$ is approximately equal to 3 $C_e$, the floating gate potential $V_{fg}$ after programming is approximately $-4$ volts.

By removing substrate region 22, and hence capacitor $C_s$, and having its function provided by channel 46 of floating gate transistor 44, as illustrated in the nonvolatile memory cell 10' of FIG. 5, the operation of the memory cell, and the final programming voltage level of the floating gate, changes as follows. Unlike substrate region 22, which can support the full high voltage of $V_D$, the channel region 40 of transistor 38 in nonvolatile memory cell 10' can at most support a surface potential which is equivalent to $V_{fg}-V_t$ where $V_t$ is the threshold voltage of transistor 38. Beyond this value, the channel is fully depleted and its capacitance contribution virtually disappears. Therefore, the floating gate voltage after programming from the above equation would be approximated by $$V_{fg} \approx V_x - V_H(C_e/(C_p+C_e)) \quad (2)$$

where again $C_p$ is the capacitance of tunneling element 28 and $C_e$ is the capacitance of tunneling element 34.

Using the same voltage levels given above by example, the floating gate voltage after programming works out to $+2$ volts, or the loss of 6 volts in programming margin as compared to nonvolatile memory cell 10.

When erasing the floating gate, i.e. tunneling electrons from floating gate 16 to third polysilicon layer 18, there is little functional difference between the embodiments of nonvolatile memory cell 10 and that of memory cell 10'. Erasing occurs when first substrate region 20 is maintained at zero volts by the data potential $V_D$. In cell 10', the surface potential of channel 46 under full inversion, i.e. where the substrate changes conductivity, provides the same function as the potential of second substrate region 22 in nonvolatile memory cell 10.

In either nonvolatile memory cell 10 or nonvolatile memory cell 10', the state of the floating gate 16 is sensed by applying a potential to first semiconductor layer 14 sufficient to invert the conductivity type of channel 50, so that the potential of third substrate region 36 is coupled to channel 46. Another potential is applied to third semiconductor layer 18 along control potential line $V_H$ also sufficient to invert the conductivity type of channel 40 to couple either of second substrate region 22 of nonvolatile memory cell 10 or virtual junction 66 of nonvolatile memory cell 10' to first substrate region 20. By applying a sense potential to data nodes represented by first substrate region 20, the sense potential will develop a sense current of value dependent on the conduction of transistor 44 at each data node, which represents one binary state. If the floating gate is sufficiently programmed, i.e. with enough negative potential, the conductivity type of channel 46 will not be inverted, therefore leaving transistor 44 off, whereby no current is enabled between first substrate region 20 and third substrate region 36. However. if floating gate 16 is erased, i.e. it contains a positive potential, conductivity of channel 46 will be inverted, thereby turning transistor 44 on, whereby a current will be developed between first substrate region 20 and third substrate region 36. The state of the sense current represents the two binary states, programmed and erased, respectively.

In the case of memory cell 10', since the cutoff characteristics of floating gate transistor 44 are not as well established as that of floating gate transistor 44 in nonvolatile memory cell 10 for the programmed state of floating gate 16, a number of strategies may be employed to reliably sense this state. One approach would be to discriminate between the higher conduction level of the erased state and the lower conduction level of the programmed state, using an intermediate reference current combined with conventional differential sensing. A second approach would be to adjust the threshold of floating gate transistor 44 upward thereby retarding the turn-on characteristics of this transistor so that the floating gate transistor 44 is cut off when floating gate 16 is in the programmed state with a less positive potential as compared to the erased state. A third approach is to lessen the potential difference between each of $V_H$, $V_R$ and $V_D$ to $V_G$. For example, the read voltage magnitude of $V_H$ may be lowered or alternatively the potential $V_G$ may be raised. Yet another approach is suggested by equation (2) decreasing of $C_p$ relative to $C_e$ sufficiently will make $V_{fg}$ go more negative, resulting in full cutoff. It is within the ordinary skill of the art to provide such sense means in a memory array.

The present invention has been described utilizing n-channel technology. It is within the ordinary skill of the art to use p-channel technology. In this regard, the potential described above would be opposite in polarity. Each semiconductor layer 14, 16 and 18 may be constructed by selectively etching deposited polysilicon. It will be appreciated that other variations and modifications to the present invention may be made without departing from the inventive concepts described herein. Accordingly, the present invention is to be limited solely by the scope of the appended claims.

What is claimed is:

1. A nonvolatile floating gate device comprising:
   a substrate of a first conductivity type having a first surface, a first substrate region and a second substrate region, each said substrate region being disposed in said first surface and being of a second conductivity type opposite said first conductivity type;
   first means for selectively applying one of a first data potential and a second data potential to said first substrate region, said first data potential being applied when data to be stored in said device has one binary state, said second data potential being applied when data to be stored in said device has the other binary state;
   a first electrically insulated semiconductor layer spaced from said first surface;
   second means for applying a first bias potential to said first semiconductor layer;
   a second electrically insulated semiconductor layer having a first portion capacitively coupled to said second substrate region and a second portion capacitively coupled to said first semiconductor layer;
   a third electrically insulated semiconductor layer having a first portion extending between said first substrate region and said second substrate region and being spaced from said first surface, and a second portion capacitively coupled to said second semiconductor layer;

third means for selectively applying a first control potential to said third semiconductor layer, said first control potential being selected to invert the conductivity type of said substrate between each said substrate region to said second conductivity type to electrically couple the potential of said first substrate region to said second substrate region, said control potential, said data potential and said bias potential being selected so that electrons are introduced onto said second semiconductor layer from said first semiconductor layer upon application of said first data potential to said first substrate region and said control potential to said third semiconductor layer for storing said one binary state, and further selected so that electrons are removed from said second semiconductor layer upon application of said second data potential to said first substrate region and said control potential to said third semiconductor layer for storing said other binary state; and means for sensing the potential of said floating gate.

2. A device as set forth in claim 1 further comprising:
a third substrate region of said second conductivity type disposed in said first surface;
fourth means for applying a reference potential to said third substrate region, said reference potential and said bias potential being selected to prevent current flow between said second substrate region and said third substrate region.

3. A device as set forth in claim 1 wherein said sensing means includes:
a third substrate region of said second conductivity type disposed in said first surface;
fourth means for applying a reference potential to said third substrate region;
a third portion of said second semiconductor layer spaced from said first surface, said third portion of said second semiconductor layer and said first semiconductor layer being adjacently disposed between said second substrate region and said third substrate region;
said second means further for applying a second bias potential to said first semiconductor layer, said second bias potential being selected to invert the conductivity of said substrate adjacent said first semiconductor layer to said second conductivity type to electrically couple the potential of one of said second substrate region and said third substrate region to a portion of said substrate adjacent said third portion of said second semiconductor layer, the other of said second substrate region and said third substrate region being electrically adjacent said portion of said substrate to form a channel region between said other of said second substrate region and said third substrate region and said substrate adjacent said first semiconductor layer;
said first means further for applying a sense potential to said first substrate region;
said third means further for applying a second control potential to said third semiconductor layer, said second control potential being selected to invert the conductivity type of said substrate between said first substrate region and second substrate region to electrically couple said sense potential applied to said first substrate region to said second substrate region, said sense potential and said reference potential being selected to develop a potential difference across said portion of said substrate adjacent said third portion of said second semiconductor layer, the conductivity of said portion of said substrate being a function of the stored binary state of said second semiconductor layer, said potential difference developing a sense current between said first substrate region and said third substrate region as a function of the conductivity of said portion of said substrate whereby said sense current has a magnitude as a function of said stored binary state; and means for detecting the magnitude of said sense current.

4. A device as set forth in claim 3 wherein said third portion of said second semiconductor layer is disposed intermediate said second substrate region and said first semiconductor layer, said first semiconductor layer being disposed intermediate said third portion of said second semiconductor layer and said third substrate region.

5. A device as set forth in claim 4 wherein said third portion of said second semiconductor layer forms a first gate of an insulated gate transistor and said first semiconductor layer forms a second gate of said transistor adjacent said first gate, said second substrate region forming one of a source and a drain of said transistor, said third substrate region forming the other of said source and said drain.

6. A device as set forth in claim 3 wherein the conductivity of said portion of said substrate adjacent said third portion of said second semiconductor layer is said first type when electrons have been introduced onto said second semiconductor layer, and said conductivity of said portion of said substrate is said second type when electrons have been removed from said second semiconductor layer.

7. A device as set forth in claim 1 wherein said third semiconductor layer forms a gate of an insulated gate transistor, said first substrate region forming a source of said transistor, said second substrate region forming a drain of said transistor.

8. A device as set forth in claim 1 wherein said substrate is p-type monocrystalline silicon.

9. A device as set forth in claim 1 wherein each said semiconductor layer is polysilicon.

10. A nonvolatile floating gate device comprising:
a substrate of a first conductivity type having a first surface;
a first electrically insulated semiconductor layer being spaced from said first surface;
first means for applying a bias potential to said first semiconductor layer;
an electrically insulated semiconductor floating gate having a first portion and a second portion, said first portion being capacitively coupled to said first semiconductor layer;
a first transistor having a gate, a source and a drain, said second portion of said floating gate being capacitively coupled to one of said source and said drain;
second means for selectively applying one of a first data potential and a second data potential to the other of said source and said drain, said first potential being applied when data to be stored in said device has one binary state, said second potential being applied when data to be stored in said device has the other binary state;
third means for selectively applying a first control potential to said gate, said control potential being selected to turn said first transistor on, each said potential being selected so that electrons are introduced onto said floating gate from said first layer upon application of said first potential to said other of said source and said drain when said transistor is turned on by said control potential, and further so that electrons are removed from said floating gate to said gate of said first transistor upon application of said second potential to said other of said source and said drain when said transistor is turned on; and means for sensing the potential of said floating gate.

11. A device as set forth in claim 10 further comprising:
a second transistor having a source and a drain, said first semiconductor layer forming a gate of said second transistor; and
fourth means for selectively applying a reference potential to one of said source and said drain of said second transistor, said reference potential and said bias potential being selected to cause said second transistor to be off.

12. A device as set forth in claim 10 wherein said sensing means includes:
a second transistor having a source and a drain, said first semiconductor layer forming a gate of said second transistor;
fourth means for selectively applying a reference potential to one of said source and said drain of said second transistor, said first means further for applying a second bias potential to said first semiconductor layer, said reference potential and said second bias potential being selected to turn said second transistor on, said third means further for applying a second control potential to said gate of said first transistor to turn said transister on with the conductivity less than when said first control potential is applied to said gate of said first transistor, said second means further for applying a sense potential to said other of said source and said drain of said first transistor;
a floating gate transistor having a gate formed by said floating gate, a source and a drain, one of said source and said drain of said floating gate transistor being coupled, to said one of said source and said drain of said first transistor, the other of said source and said drain of said floating gate transistor being coupled to the other of said source and said drain of said second transistor, the conductivity of said floating gate transistor being a function of the data state stored by said floating gate, said sense potential and said reference potential being selected to develop a sense current between said other of said source and said drain of said first transistor to which said sense potential is applied and said one of said source and said drain of said second transistor to which said reference potential is applied, said sense current having the magnitude as the function of the conductivity of said floating gate transistor; and
means for detecting the magnitude of said sense current.

13. A device as set forth in claim 10 wherein said sensing means includes:
a second transistor having a source and a drain, said first semiconductor layer forming a first gate of said transistor, said floating gate forming a second gate of said transistor adjacent said first gate;
fourth means for selectively applying a reference potential to one of said source and said drain of said second transistor, the other of said source and said drain of said second transistor being formed by said one of said source and said drain of said first transistor, said first means further for applying a second bias potential to said first semiconductor layer, said reference potential and said second bias potential being selected to invert the conductivity of said substrate adjacent said first gate, said third means further for applying a second control potential to said gate of said first transistor to turn said transister on with a conductivity less than when said first control potential is applied to said gate of said first transistor, said first means further for applying a sense potential to said other of said source and said drain of said first transistor, the conductivity of said second transistor being a function of the data state stored by said floating gate, said sense potential and said reference potential being selected to develop a sense current between said one of said source and said drain of said first transistor and said one of said source and said drain of said second transistor, said sense current having a magnitude as a function of the conductivity of said second transistor; and
means for detecting said magnitude of said sense current.

14. A device as set forth in claim 13 wherein each said data potential is applied to said drain of said first transistor, said source of said first transistor being coupled to said drain of said second transistor, said reference potential being applied to the source of said second transistor.

15. A device as set forth in claim 14 wherein said second transistor is turned on when electrons are removed from said floating gate and is turned off when electrons are introduced onto said floating gate in the presence of said second bias potential and said reference potential being applied to said first gate and said source of said second transistor.

16. A nonvolatile floating gate device comprising:
a substrate of a first conductivity type having a first surface and a first substrate region disposed in said first surface, said first substrate region being of a second conductivity type opposite said first conductivity type;
first means for selectively applying one of a first data potential and a second data potential to said first substrate region, said first potential being applied when data to be stored in said device has one binary state, said second potential being applied when data to be stored in said device has the other binary state;
a first electrically insulated semiconductor layer;
second means for applying a bias potential to said first semiconductor layer;
a second electrically insulated semiconductor layer having a first portion capacitively coupled to said first layer and a said cond portion capacitively coupled to a preselected area of said first surface;
a third electrically insulated semiconductor layer having a first portion capacitively coupled to said second portion of said second semiconductor layer and a second portion being capacitively coupled to said first surface and adjacent an edge of said first substrate region, said second portiion of said third layer being disposed generally intermediate said first substrate region and said second portion of said second layer;

third means for selectively applying a control potential to said third semiconductor layer, said control potential being selected to invert the conductivity type of said first surface capacitively coupled to said second portion of said third layer to said second conductivity type to electrically couple the potential of said first region to a portion of said surface of said substrate capacitively coupled to said second portion of said second semiconductor layer, each said potential being selected so that electrons are introduced onto said second layer from said first layer on application of the first potential to said region and said third potential to said third layer, and further so that electrons are removed from said second layer to said third layer upon application of said second potential to said first region and said third potential to said third layer;

means for sensing the potential of said floating gate.

17. A device as set forth in claim 16 further comprising:

a second substrate region of said second conductivity type disposed in said first surface;

fourth means for applying a reference potential to said second substrate region, said reference potential and said bias potential being selected to prevent current between said second substrate region and said preselected area of said first surface.

18. A device as set forth in claim 16 wherein said sensing means includes:

second substrate region of said second conductivity type disposed in said first surface;

fourth means for applying a reference potential to said second substrate region;

said second means further for applying a second bias potential to said first semiconductor layer, said second bias potential being selected to invert the conductivity of said substrate adjacent said first semiconductor layer to said second conductivity type to electrically couple the potential of said second substrate region to a portion of said substrate adjacent said second portion of said second semiconductor layer;

said first means further for applying a sense potential to said first substrate region;

said third means further for applying a second control potential to said third semiconductor layer, said second control potential being selected to invert the conductivity type of said substrate capacitively coupled to said second portion of said third layer to electrically couple said sense potential applied to said first substrate region to said portion of said substrate adjacent said second portion of said second semiconductor layer, said sense potential and said reference potential being selected to develop a potential difference across said portion of said substrate adjacent said second portion of said second semiconductor layer, the conductivity of said portion of said substrate being a function of the stored binary state of said second semiconductor layer, said potential difference developing a sense current between said first substrate region and said second substrate region as a function of the conductivity of said portion of said substrate whereby said sense current has a magnitude as a function of said stored binary state; and means for detecting the magnitude of said sense current.

19. A device as set forth in claim 18 wherein said second portion of said second semiconductor layer is disposed intermediate said second portion of said third semiconductor layer and said first semiconductor layer, said first semiconductor layer being disposed intermediate said second portion of said second semiconductor layer and said second substrate region.

20. A device as set forth in claim 19 wherein said first semiconductor layer forms a first gate of an insulated gate transistor, said second portion of said second semiconductor layer forms a second gate of said transistor adjacent said first gate, and said second portion of said third semiconductor layer forms a third gate of said transistor adjacent said second gate, said first substrate region forming one of a source and a drain of said transistor, said second substrate region forming the other of said source and said drain.

21. A device as set forth in claim 18 wherein the conductivity of said portion of said substrate adjacent said second portion of said second semiconductor layer is said first type when electrons have been introduced onto said second semiconductor layer, and said conductivity of said portion of said substrate is said second type when electrons have been removed from said second semiconductor layer.

22. A device as set forth in claim 16 wherein said substrate is p-type monocrystalline silicon.

23. A device as set forth in claim 16 wherein each said semiconductor layer is polysilicon.

24. A nonvolatile floating gate device comprising:

a substrate of a first conductivity type having a first surface;

a first electrically insulated semiconductor layer being spaced from said first surface;

first means for applying a first bias potential to said first semiconductor layer;

a second electrically insulated semiconductor layer having a first portion capacitively coupled to said first semiconductor layer and a second portion being spaced from said first surface;

a third electrically insulated semiconductor layer having a first portion capacitively coupled to said second semiconductor layer and a second portion being spaced from said first surface;

a transistor having a source and a drain, said first semiconductor layer forming a first gate of said transistor, said second portion of said second semiconductor layer forming a second gate of said transistor and said second portion of said third semiconductor layer forming a third gate of said transistor;

second means for selectively applying one of a first data potential and a second data potential to one of said source and said drain, said first data potential being applied when data to be stored in device has one binary state, said second data potential being applied when data to be stored in said device has the other binary state;

third means for applying a reference potential to the other of said sources and said drain, said reference potential and said first bias potential being selected to maintain said transistor off;

fourth means for selectively applying a control potential to said third gate, said control potential being selected to invert the conductivity type of said substrate adjacent said third gate to couple the potential of said one of said source and said drain to a portion of said substrate adjacent said second gate, each said potential being selected so that electrons are introduced onto said second semiconductor layer from said first semiconductor layer upon application of said first potential to said one of said source and said drain when said control potential is applied to said third gate, and further so that electrons are removed from said semiconductor layer to said third semiconductor layer upon application of said second potential to said one of said source and said drain when said control potential is applied to said third gate; and means for sensing the potential of said second semiconductor layer.

25. A device as set forth in claim 24 wherein said sensing means includes:

said first means further for applying a second bias potential to said first gate of said transistor, said second bias potential being selected to invert the conductivity type of said substrate adjacent said first gate;

said fourth means further for applying a second control potential to said third gate, said second control potential being selected to invert the conductivity type of said substrate adjacent said third gate;

said second means further for applying a sense potential to said one of said source and said drain, the conductivity of said substrate adjacent said second gate being a function of the data state stored by said second semiconductor layer, said sense potential and said reference potential being selected to develop a sense current between said source and said drain of said transistor, said sense current having a magnitude as a function of the conductivity of said substrate adjacent the second portion of said second semiconductor layer; and means for detecting said magnitude of said sense current.

26. A device as set forth in claim 25 wherein each said data potential is applied to said drain of said transistor, said reference potential being applied to said source of said transistor.

27. A device as set forth in claim 26 wherein said transistor is turned on when electrons are removed from said second semiconductor layer and is turned off when electrons are introduced onto said second semiconductor layer in the presence of said second bias potential and said reference potential being applied to said first gate and said source of said transistor.

28. An integrated circuit memory device having a plurality of nonvolatile memory cells interconnected into an array having a plurality of rows and a plurality of columns, said device comprising:

a semiconductor substrate of a first conductivity type having a first surface in which said memory cells are disposed, a plurality of first substrate regions, a plurality of second substrate regions and a third substrate region, each of said substrate regions being of a second conductivity type opposite said first conductivity type, each of said first substrate regions being disposed within a portion of said cells along an associated one of said columns, each of said second substrate regions being disposed in an associated one of said memory cells, said third substrate region being disposed within a portion of all of said cells;

first means for applying a reference potential to said third substrate region;

second means for selectively applying one of a first data potential representing a first binary data state and a second data potential representing a second binary data state to selected ones of said first substrate regions;

a first electrically insulated semiconductor layer spaced from said first surface and overlying a portion of each of said cells forming a first channel region in said first surface in each of said cells, each said first channel region being adjacent a portion of said third substrate region within the associated one of said cells;

third means for applying a first bias potential to said first semiconductor layer, said bias potential and said reference potential being selected to electrically isolate said first channel region in each of said cells from said third substrate region;

a plurality of second electrically insulated semiconductor layers, each of said second semiconductor layers being associated with one of said cells and having a first portion capacitively coupled to a portion of said first semiconductor layer within said associated one of said cells and a second portion capacitively coupled to said second substrate region in said associated one of said cells;

a plurality of third electrically insulated semiconductor layers spaced from said first surface, each of said third layers being associated with one of said rows and overlying a portion of each of said cells in the associated one of said rows and having a plurality of first portions and a plurality of second portions, each of said first portions of said third layer being capacitively coupled to an associated one of said second semiconductor layers, each of said second portions of said third layer overlying a portion of said substrate in the associated one of said cells forming a second channel region in each of said cells, said second channel region in each one of said cells being intermediate a portion of one of said first substrate regions associated with said one of said cells and said second substrate region in said one of said cells;

fourth means for selectively applying a first control potential to a selected one of said third semiconductor layers, said control potential being selected to invert the conductivity type of said second channel region to said second conductivity type to electrically couple the potential of one of said first substrate regions associated with each of said cells in said selected row to said second substrate region in each of said cells in said selected row, each said potential being selected so that electrons are introduced onto said second semiconductor layer in each of said cells along said selected row from said first semiconductor layer when said first data potential is applied to said associated one of said first substrate regions and so that electrons are removed from said second semiconductor layer to one of said third semiconductor layers associated with said one of said cells when said second data potential is applied to the associated one of said first substrate regions; and means for sensing the potential of each of said second semiconductor layers.

29. An integrated circuit memory device having a plurality of nonvolatile memory cells interconnected into an array having a plurality of rows and a plurality of columns, said device comprising:

a semiconductor substrate of a first conductivity type having a first surface in which said memory cells are disposed, a plurality of first substrate regions and a second substrate region, each of said substrate regions being of a second conductivity type opposite said first conductivity type, each of said first substrate regions being disposed within a portion of said cells along an associated one of said columns, said second substrate region being disposed within a portion of all of said cells;

first means for applying a reference potential to said second substrate region;

second means for selectively applying one of a first data potential representing a first binary data state and a second data potential representing a second binary data state to selected ones of said first substrate regions;

a first electrically insulated semiconductor layer spaced from said first surface and overlying a portion of each of said cells forming a first channel region in said first surface in each of said cells, each said first channel region being adjacent a portion of said third substrate region within the associated one of said cells;

third means for applying a first bias potential to said first semiconductor layer, said bias potential and said reference potential being selected to electrically isolate said first channel region in each of said cells from said third substrate region;

a plurality of second electrically insulated semiconductor layers, each of said second semiconductor layers being associated with one of said cells and having a first portion capacitively coupled to a portion of said first semiconductor layer within said associated one of said cells and a second portion overlying a portion of said substrate in said associated one of said cells forming a second channel region in each of said cells;

a plurality of third electrically insulated semiconductor layers spaced from said first surface, each of said third layers being associated with one of said rows and overlying a portion of each of said cells in the associated one of said rows and having a plurality of first portions and a plurality of second portions, each of said first portions of said third layer being capacitively coupled to an associated one of said second semiconductor layers, each of said second portions of said third layer overlying a portion of said substrate in the associated one of said cells forming a third channel region in each of said cells, said third channel region in each one of said cells being intermediate a portion of one of said first substrate regions associated with said one of said cells and said second channel region in said one of said cells;

fourth means for selectively applying a first control potential to a selected one of said third semiconductor layers, said control potential being selected to invert the conductivity type of said third channel region to said second conductivity type to electrically couple the potential of one of said first substrate regions associated with each of said cells in said selected row to said second channel region in each of said cells in said selected row, each said potential being selected so that electrons are introduced onto said second semiconductor layer in each of said cells along said selected row from said first semiconductor layer when said first data potential is applied to said associated one of said first substrate regions and so that electrons are removed from said second semiconductor layer to one of said third semiconductor layers associated with said one of said cells when said second data potential is applied to the associated one of said first substrate regions; and means for sensing the potential of each of said second semiconductor layers.

* * * * *